United States Patent [19]

Shekar et al.

[11] Patent Number: 5,471,075
[45] Date of Patent: Nov. 28, 1995

[54] DUAL-CHANNEL EMITTER SWITCHED THYRISTOR WITH TRENCH GATE

[75] Inventors: Mallikarjunaswamy S. Shekar, Santa Clara, Calif.; B. Jayant Baliga, Raleigh, N.C.; Jacek Korec, Mörfelden-Walldorf, Germany

[73] Assignee: North Carolina State University, Raleigh, N.C.

[21] Appl. No.: 249,898

[22] Filed: May 26, 1994

[51] Int. Cl.⁶ .......................... H01L 29/74; H01L 31/111
[52] U.S. Cl. .......................... 257/139; 257/147; 257/151
[58] Field of Search .................. 257/147, 133, 257/110, 155, 151, 153, 138, 139, 330, 331, 152

[56] References Cited

U.S. PATENT DOCUMENTS

| | | | |
|---|---|---|---|
| 4,443,931 | 4/1984 | Baliga et al. | 257/147 |
| 4,571,815 | 2/1986 | Baliga et al. | 257/147 |
| 4,587,712 | 5/1986 | Baliga | 257/147 |
| 4,827,321 | 5/1989 | Baliga | 257/147 |
| 4,903,189 | 2/1990 | Ngo et al. | 257/147 |
| 4,928,155 | 5/1990 | Nakagawa et al. | 257/335 |
| 4,961,100 | 10/1990 | Baliga et al. | 257/147 |
| 4,985,738 | 1/1991 | Nishizawa et al. | 257/138 |
| 5,014,102 | 5/1991 | Adler | 257/147 |
| 5,023,196 | 6/1991 | Johnsen et al. | 257/330 |
| 5,032,888 | 7/1991 | Seki | 257/331 |
| 5,086,323 | 2/1992 | Nakagawa et al. | 257/139 |
| 5,089,864 | 2/1992 | Sakurai | 257/139 |
| 5,093,701 | 3/1992 | Nakagawa et al. | 257/139 |
| 5,099,300 | 3/1992 | Baliga | 257/147 |
| 5,105,244 | 4/1992 | Bauer | 257/147 |
| 5,155,569 | 10/1992 | Terashima | 257/147 |
| 5,164,325 | 11/1992 | Cogan et al. | 257/330 |
| 5,168,331 | 12/1992 | Yilmaz | 257/330 |
| 5,198,687 | 3/1993 | Baliga | 257/147 |
| 5,202,750 | 4/1993 | Gough | 257/147 |
| 5,293,054 | 3/1994 | Shekar et al. | 257/147 |
| 5,294,816 | 3/1994 | Shekar et al. | 257/147 |
| 5,304,821 | 4/1994 | Hagino | 257/147 |
| 5,306,930 | 4/1994 | Baliga | 257/147 |
| 5,317,171 | 5/1994 | Shekar et al. | 257/138 |
| 5,319,222 | 6/1994 | Shekar et al. | 258/138 |
| 5,412,228 | 5/1995 | Baliga | 257/133 |

OTHER PUBLICATIONS

Iwamuro et al., *Forward Biased Safe Operating Area of Emitter Switched Thyristors*, IEEE Transactions on Electron Devices, vol. 42, No. 2, Feb. 1995, pp. 334–339.

Baliga et al., "The Insulated Gate Rectifier (*IGR*): A New Power Switching Device", International Electron Device Meeting, (1982) Abstract No. 10.6, pp. 264–266.

Yilmaz et al., "Insulated Gate Transistor Physics: Modeling and Optimization of the On–State Characteristics", IEEE Transactions on Electron Devices, vol. ED–32, No. 12, Dec. 1985, pp. 2812–2818.

(List continued on next page.)

*Primary Examiner*—Wael M. Fahmy
*Attorney, Agent, or Firm*—Bell, Seltzer, Park & Gibson

[57] ABSTRACT

A semiconductor switching device includes a plurality of adjacent and parallel-connected switching cells in a semiconductor substrate. Each cell includes a thyristor having a floating emitter region and a trench-gate field effect transistor (TFET) for providing turn-on and turn-off control of the thyristor. In one embodiment of the switching device, parasitic thyristor latch-up is suppressed by using a dual-channel TFET which forms both inversion-layer and accumulation-layer channel connections in series between respective floating emitter regions and the cathode contact. In another embodiment, parasitic thyristor latch-up is prevented by joining floating emitter regions of a pair of adjacent cells to thereby eliminate a parasitic P-N-P-N path between the anode and cathode contacts. According to this second embodiment, a dual-channel TFET is preferably used to form a separate first conductivity type inversion-layer channel adjacent a first sidewall of the trench and a second conductivity type inversion-layer channel adjacent a second opposing sidewall of the trench. These channels provide the necessary electrical connections for both gated turn-on and turn-off control.

17 Claims, 8 Drawing Sheets

OTHER PUBLICATIONS

Baliga et al., "*The MOS Depletion–Mode Thyristor: A New MOS–Controlled Bipolar Power Device*", IEEE Electron Device Letters, vol. 9, No. 8, Aug. 1988, pp. 411–413.

Ueda et al., "*Deep–Trench Power MOSFET with an Ron Area Product of 160 m$\pi$–mm$^2$,*" International Electron Device Meeting (1986), Abstract 28.2, pp. 638–641.

Chang et al., *Comparison of N and P Channel IGTs*, International Electron Device Meeting (1984), Abstract 10.6, pp. 278–281.

Baliga, *Modern Power Devices*, Chapters 6 and 7, pp. 263–406.

Ueda et al., *An Ultra–Low On–Resistance Power MOSFET Fabricated by Using a Fully Self–Aligned Process*, IEEE Transactions on Electron Devices, vol. ED–34, No. 4, Apr. 1987, pp. 926–930.

Chang, *Numerical and Experimental Comparison of 60V Vertical Double–Diffused MOSFETS and MOSFETS with a Trench–Gate Structure*; Solid–State Electronics, vol. 32, No. 3, 1989, pp. 247–251.

Bulucea et al., *Trench DMOS Transistor Technology for High–Current (100A Range) Switching*, Solid–State Electronics, vol. 34, No. 5, 1991, pp. 493–507.

Syau et al., *Extended Trench–Gate Power UMOSFET Structure with Ultralow Specific On–Resistance*, Electronics Letters, vol. 28, No. 9, Apr. 1992, pp. 865–867.

Baliga et al., *The Insulated Gate Transistor: A New Three–Terminal MOS–Controlled Bipolar Power Device*, IEEE Transactions on ELectron Devices, vol. ED–31, No. 6, Jun. 1984, pp. 821–828.

Russell et al., *The COMFET–A New High Conductance MOS–Gated Device*, IEEE Electron Device Letters, vol. EDL–4, No. 3, Mar. 1983, pp. 63–65.

Goodman et al., *Improved COMFETs with Fast Switching Speed and High–Current Capability*, International Electron Device Meeting (1983) Abstract No. 4.3, pp. 79–82.

Nakagawa et al., *Non–Latch–Up 1200V 75A Bipolar–Mode MOSFET with Large ASO*, International Electron Device Meeting (1984) Abstract No. 16.8, pp. 860–861.

Temple, *MOS Controlled Thyristors (MCT's)*, International Electron Device Meeting, (1984) Abstract No. 10.7, pp. 282–285.

Nandakumar et al., *A New MOS–Gated Power Thyristor Structure with Turn–Off Achieved by Controlling the Base Resistance*, IEEE Electron Device Letters, vol. 12, No. 5, May 1991, pp. 227–229.

Baliga, *The MOS–Gated Emitter Switched Thyristor*, IEEE Electron Device Letters, vol. 11, No. 2, Feb. 1990, pp. 75–77.

Shekar et al., *High–Voltage Current Saturation in Emitter Switched Thyristors*, IEEE Electron Device Letters, vol. 12, No. 7, Jul. 1991, pp. 387–389.

DUAL-CHANNEL EMITTER SWITCHED THYRISTOR WITH TRENCH GATE

CROSS REFERENCE TO RELATED APPLICATIONS

This application is related to application Ser. No. 08/249,449, entitled LATCH-UP RESISTANT BIPOLAR TRANSISTOR WITH TRENCH IGFET AND BURIED COLLECTOR (Attorney Docket No. 5051-254), filed concurrently herewith, the disclosure of which is hereby incorporated herein by reference.

FIELD OF THE INVENTION

The present invention relates to semiconductor switching devices, and more particularly to transistors with gated turn-on and turn-off control.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias signal. For example, turn-on in an N-type enhancement MOSFET occurs when a conductive N-type inversion-layer is formed in the P-type active (or channel) region in response to the application of a positive gate bias signal. The inversion-layer electrically connects the N-type source and drain regions and allows for majority carrier conduction therebetween.

The power MOSFET's gate electrode is separated from the active (or channel) region by an intervening insulating layer, typically silicon dioxide. Because the gate is insulated from the active (or channel) region, little if any gate current is required to maintain the MOSFET in a conductive state or to switch the MOSFET from an on-state to an off-state or vice-versa. The gate current is kept small during switching because the gate forms a capacitor with the MOSFET's active (or channel) region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

Figure 1:
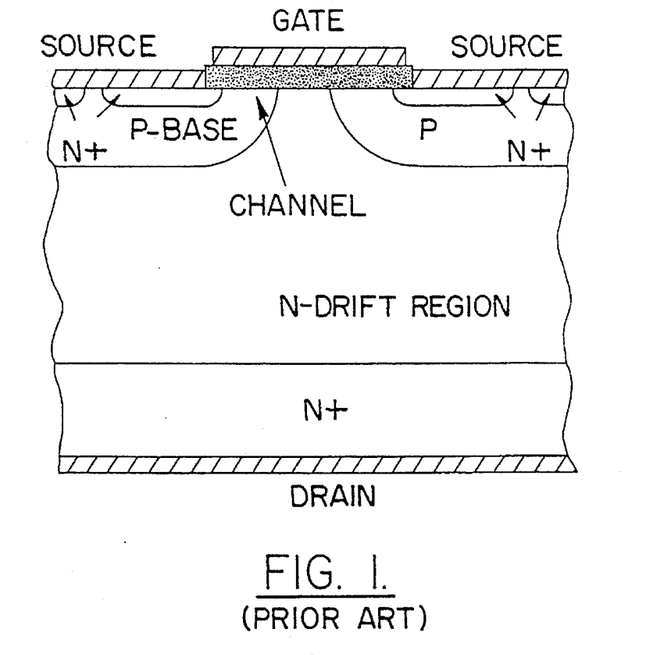
FIG. 1 is a cross-sectional illustration of a prior art silicon power DMOSFET.

In view of these desirable characteristics, many variations of power MOSFETs have been designed. Two popular types are the double-diffused MOS (DMOS) device and the ultra-low on-resistance MOS device (UMOS). The DMOS structure and its operation and fabrication are described in the textbook by coinventor Baliga entitled *Modern Power Devices,* the disclosure of which is hereby incorporated herein by reference. Chapter 6 of this textbook describes power MOSFETs at pages 263–343. FIG. 1 herein is a reproduction of FIG. 6.1(a) from the above cited textbook, and illustrates a cross-sectional view of a basic DMOS structure. The DMOS structure is fabricated using planar diffusion technology.

Figure 2:
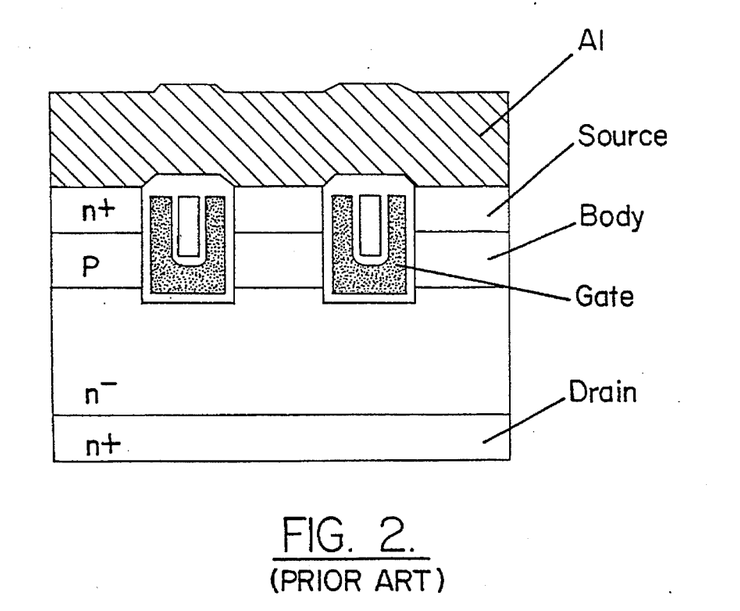
FIG. 2 is a cross-sectional illustration of a prior art silicon power UMOSFET.

The UMOS device, also referred to as a "Trench DMOS" device, is described in publications entitled: *An Ultra-Low On-Resistance Power MOSFET Fabricated by Using a Fully Self-Aligned Process,* by Ueda et al., IEEE Transactions on Electron Devices, Vol. ED34, No. 4, April (1987), pp. 926–930; *Numerical and Experimental Comparison of 60V Vertical Double-Diffused MOSFETS and MOSFETS with a Trench-Gate Structure* by Chang, Solid State Electronics, Vol. 32, No. 3, pp. 247–251 (1989); *Trench DMOS Transistor Technology for High-Current* (100A Range) *Switching* by Bulucea et al., Solid State Electronics, Vol. 34, No. 5, pp. 493–507 (1991); and *Extended Trench-Gate Power UMOSFET Structure with Ultralow Specific On-Resistance,* by Syau et al., Electronics Letters, Vol. 28, No. 9, pp. 865–867 (1992). FIG. 2 herein is a reproduction of a portion of FIG. 1 of the above identified Ueda et al. publication illustrating an embodiment of the UMOS structure.

Figure 3:
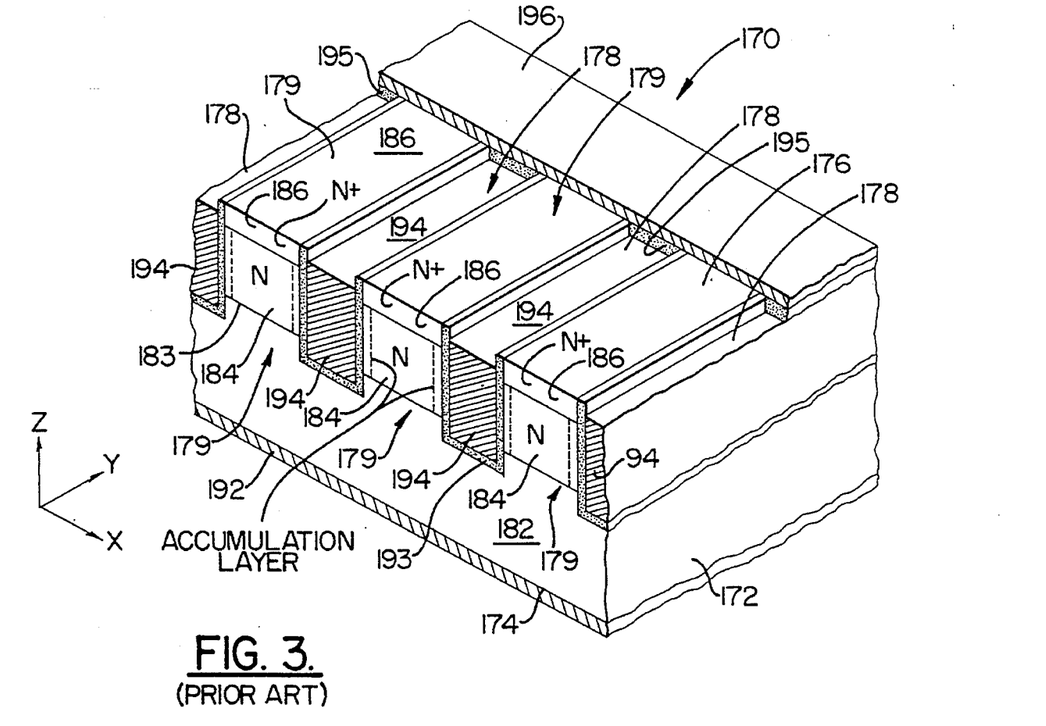
FIG. 3 is a cross-sectional illustration of a prior art silicon ACCUFET.

A third example of a silicon power MOSFET is shown in FIG. 3. FIG. 3 is a reproduction of FIG. 4 from U.S. Pat. No. 4,903,189 to Ngo et al. and coinventor Baliga, the disclosure of which is hereby incorporated herein by reference. This MOSFET 170, which includes trenches 178 at a face thereof and contains no P-N junctions, is commonly referred to as an accumulation-mode FET ("ACCU-FET") because turn-on is achieved by forming a conductive accumulation layer between the FET's source 186 and drain 182 regions. FIG. 3 shows a plurality of parallel connected ACCU-FET cells, each defined by mesas 179 and opposing trenches 178.

Figure 4A:
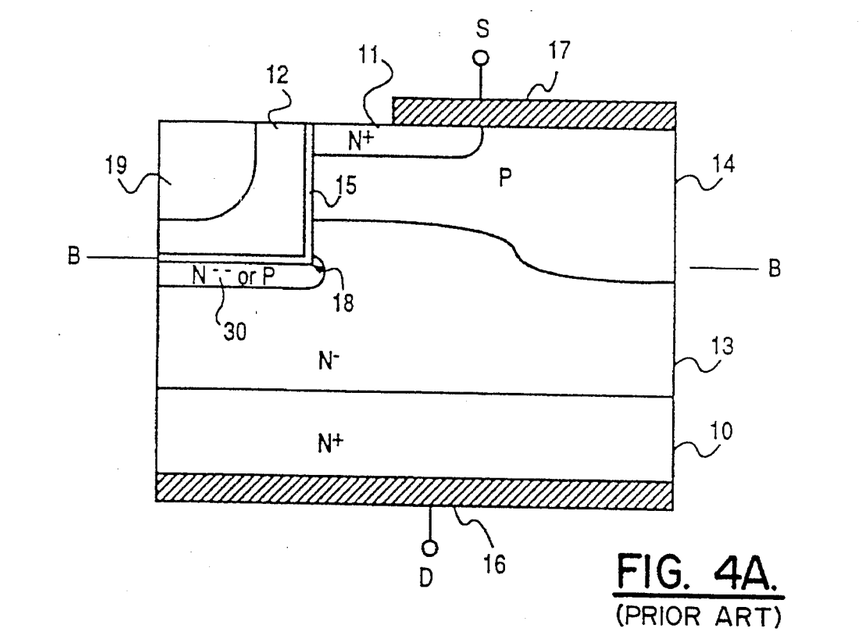
FIG. 4A is a cross-sectional illustration of a prior art high-power MOSFET.

A fourth example of a vertical power MOSFET is shown in FIG. 4A. FIG. 4A is a reproduction of FIG. 3 from U.S. Pat. No. 5,168,331 to H. Yilmaz. In particular, this MOSFET includes a "free floating" shield region 30 (P or N-) which serves as a buffer to reduce the strength of the electric field at point 18, which is adjacent to a corner in the profile of the gate 12.

The above-described beneficial characteristics of power MOSFETs are typically offset, however, by the relatively high on-resistance of the MOSFET's active region, which arises from the absence of minority carrier injection. As a result, a MOSFET's operating forward current density is typically limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. One example of a hybrid device is the Insulated Gate Bipolar Transistor (IGBT), disclosed in section 7.2 of the aforementioned Baliga textbook.

The IGBT combines the high impedance gate of the power MOSFET with the small on-state conduction losses of the power bipolar transistor. An added feature of the IGBT is its ability to block both forward and reverse bias voltages. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

One embodiment of an IGBT is disclosed in an article by coinventor B. J. Baliga and M. S. Adler, R. P. Love, P. V. Gray and N. Zommer, entitled *The Insulated Gate Transistor: A New Three terminal MOS Controlled Bipolar Power Device*, IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by the conductivity modulation of the IGBT's drift region during the on-state. Moreover, very high conduction current densities in the range of 200–300 A/cm$^2$ were also achieved. Accordingly, an IGBT can be expected to have a conduction current density approximately 20 times that of a power MOSFET and five (5) times that of an equivalent bipolar transistor. Typical turn-off times for the IGBT can be in the range of 10–50 μs.

Figure 5A:
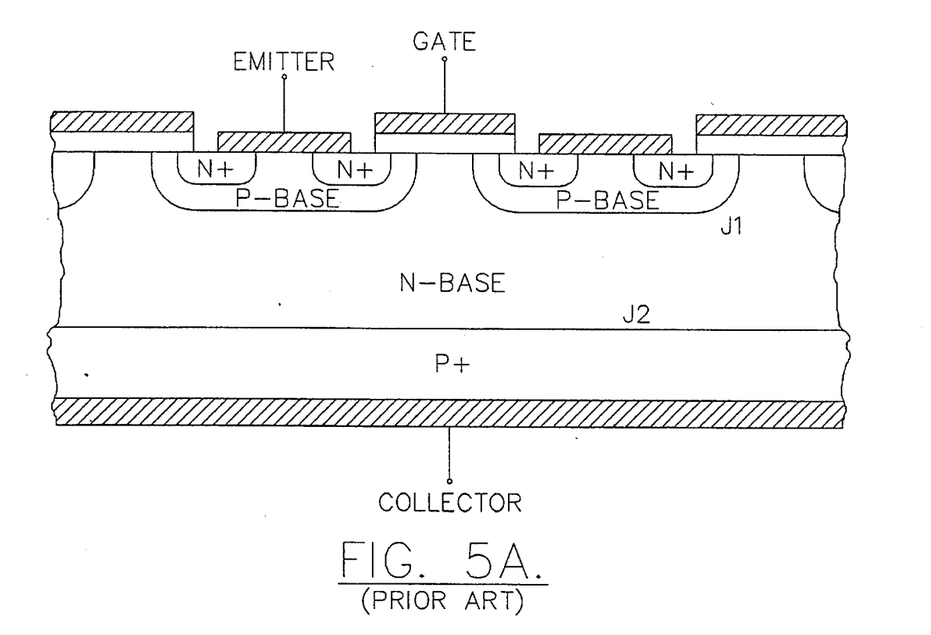
FIG. 5A is a cross-sectional illustration of a prior art IGBT.

The basic structure of the IGBT is shown in cross-section in FIG. 5A, which is a reproduction of FIG. 1 from the aforementioned Baliga et al. article. In the IGBT, forward conduction can occur by positively biasing the anode (or electron "collector") with respect to the cathode (or electron "emitter") and applying a positive gate bias signal of sufficient magnitude to invert the surface of the P-base region under the gate. By creating an inversion-layer in the P-base region, electrons are allowed to flow from the N+ emitter region to the N-base region. In this forward conducting state, the junction J2 is forward biased and the P+ anode region injects holes into the N-Base region. As the anode bias is increased, the injected hole concentration increases until it exceeds the background doping level of the N-base. In this regime of operation, the device operates like a forward-biased P-i-N diode with heavy conductivity modulation of the N-base region. In the reverse bias region, the anode is biased negative with respect to the cathode and the lower junction (J3) is reversed biased, thereby preventing conduction from the cathode to anode even though the upper junction (J2) is forward biased. This provides the device with its reverse blocking capability.

Figure 4B:
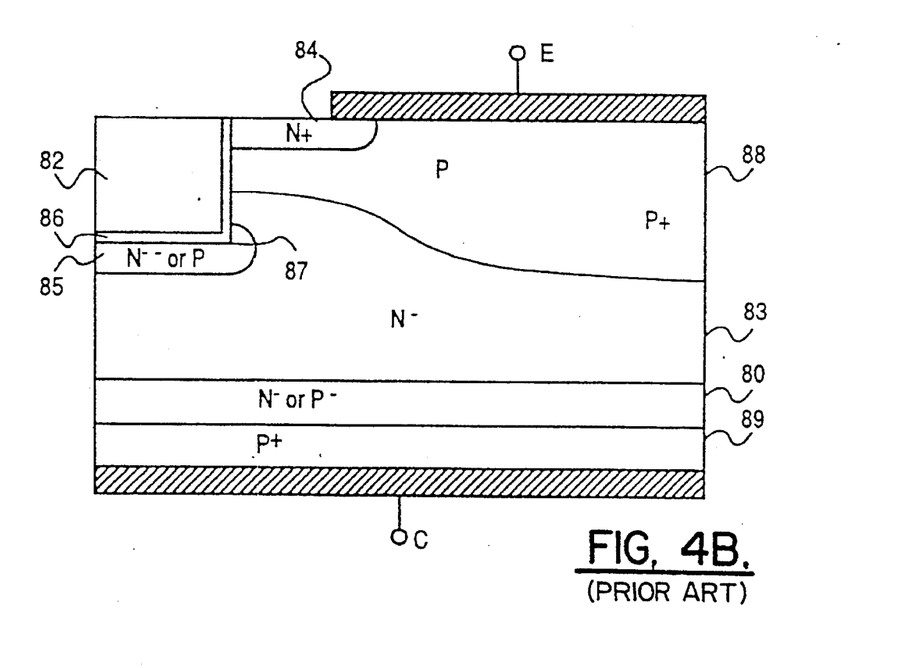
FIG. 4B is a cross-sectional illustration of another prior art IGBT.

Another IGBT which includes a "free floating" shield region for improving the reverse blocking capability is shown in FIG. 4B, which is a reproduction of FIG. 10 from the aforementioned '331 patent to Yilmaz. In particular, this IGBT includes a "free floating" shield region 85 (P or N-) which serves as a buffer to reduce the strength of the electric field at point 87, which is adjacent to a corner in the profile of the gate 82.

Figure 5B:
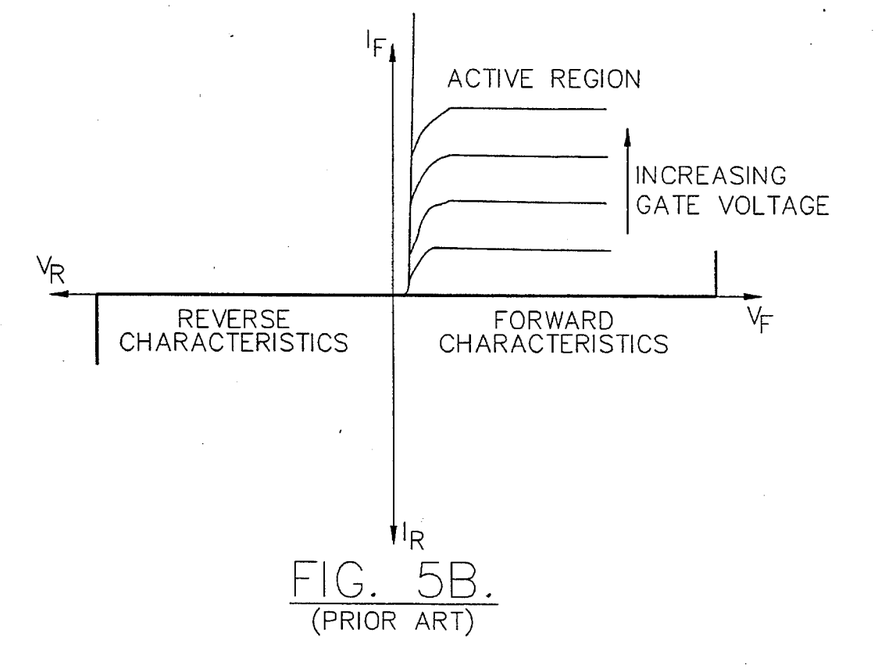
FIG. 5B is a simulated graph of current versus voltage for the IGBT of FIG. 5A, at various gate voltages.

The IGBT can typically operate at high current densities even when designed for operation at high blocking voltages. As long as the gate bias is sufficiently large to produce enough inversion-layer charge for providing electrons into the N-base region, the IGBT forward conduction characteristics will look like those of a P-i-N diode. However, if the inversion-layer conductivity is low, a significant voltage drop will begin to appear across this region like that observed in conventional MOSFETs. At this point, the forward current will saturate and the device will operate in its active or current saturation region, as shown in FIG. 5B, which is a reproduction of FIG. 2 from the aforementioned Baliga et al. article. As will be understood by those skilled in the art, high voltage current saturation is ultimately limited by avalanche induced breakdown. Finally, because the elimination of the inversion-layer cuts off the supply of electrons into the N-base region and because there is no self-sustaining source of electrons to the N-base region, the IGBT will typically turn off even if the anode remains positively biased.

It is recognized that although gate-controlled bipolar transistors, such as the IGBT, represent a significant improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased. Most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the cross-coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's cross-coupled P1-N1-P2 and wide base P1-N2-P2 transistors ($\alpha_{pnp}$, $\alpha_{npn}$) exceeds unity. When this occurs, each transistor drives the other into saturation and provides the other with a self-sustaining (i.e., regenerative) supply of carriers to the respective transistor's base region. An alternative to providing external circuitry or reversing the anode potential to obtain turn-off, however, is to use a MOS-gate for controlling turn-on and turn-off.

Several methods for obtaining MOS-gated control over thyristor action, including sustained latch-up, exist. For example, in the MOS-controlled thyristor (MCT), turn-off is provided by shorting the emitter-base junction of the N-P-N transistor to thereby produce a reduction in gain. This form of control ideally raises the holding current of the thyristor to a level above the operating current level. An MCT structure has been reported which utilizes a P-channel MOSFET integrated into the cathode region of a thyristor for turn-off control, and an N-channel MOSFET integrated into the P-base region for turn-on control. This device and its complementary counterpart are described in an article by V. A. K. Temple, entitled *"MOS Controlled Thyristors (MCT's),"* published in IEDM Technology Digest, Abstract 10.7, pp. 282–285, (1984). However, the maximum controllable current density, which is a direct measure of a device's ability to turn-off, is limited by the MOSFET inversion-layer channel resistance and other resistances in the base region. Because of the lower mobility of holes in silicon, MCT's built from n-type high-voltage drift layers exhibit relatively poor current turn-off characteristics.

An example of a MOS-gated thyristor which overcame many of the drawbacks associated with the MCT is the depletion-mode thyristor (DMT). This device is described in an article by coinventor B. J. Baliga and H. Chang, entitled *"The MOS Depletion-Mode Thyristor: A New MOS-Controlled Bipolar Power Device,"* published in IEEE Electron Device Letters, Vol. 9, No. 8, August (1988). In the DMT, a depletion-mode MOSFET is placed in series with the base one of the coupled transistors (i.e., $P^+$-$N^+$N-P transistor). Accordingly, once the thyristor is turned-on, current flow can be interrupted by the application of a negative gate bias signal to the depletion-mode MOSFET. This is because the application of a negative gate bias signal causes the MOSFET to switch off and causes the base drive current to the $P^+$-$N^+$N-P coupled transistor to be pinched off.

Recently, a base resistance controlled thyristor (BRT) was described in U.S. Pat. No. 5,099,300, by coinventor B. J. Baliga, issued Mar. 24, 1992, and in an article entitled *"A New MOS-Gated Power Thyristor Structure with Turn-Off Achieved by Controlling the Base Resistance,"* by M. Nandakumar, coinventors B. J. Baliga, M. S. Shekar, and S. Tandon and A. Reisman, IEEE Electron Device Letters, Vol. 12, No. 5, pp. 227–229, May, 1991, both of which are hereby incorporated herein by reference. The BRT operates by modulating the lateral P-base resistance of the thyristor using MOS gate control. The BRT can be turned-off by the application of a negative gate bias signal to a P-channel enhancement-mode MOSFET to thereby reduce the resistance of the P-base by shunting majority charge carriers to the cathode. As will be understood by one skilled in the art, the reduction in P-base resistance causes an increase in the device's holding current to above the operational current level and shuts-off the device.

A BRT with both single-polarity and dual-polarity turn-on and turn-off control is also described in U.S. Pat. No. 5,198,687, to coinventor B. J. Baliga, issued Mar. 30, 1993, the disclosure of which is hereby incorporated herein by reference. In this BRT, a depletion-mode MOSFET is provided for electrically connecting the second base region to a diverter region. The depletion-mode MOSFET turns the thyristor off by shunting current from the second base region to the cathode region, via the diverter region, in response to an appropriate polarity bias signal.

Figures 6A, 6B:
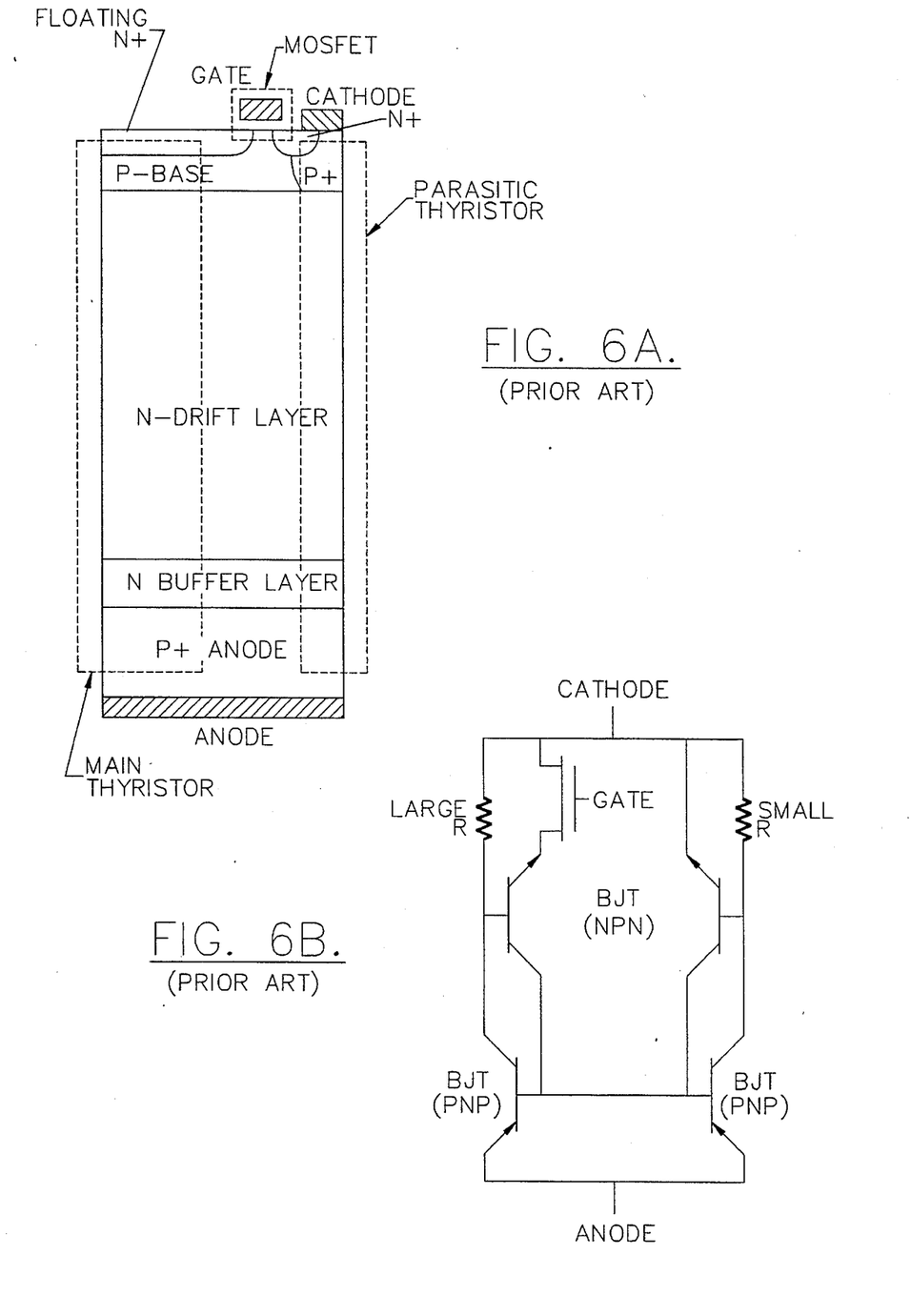
FIG. 6A is a cross-section illustration of a prior art emitter switched thyristor (EST).
FIG. 6B is an electrical schematic illustration of the prior art emitter switched thyristor (EST) of FIG. 6A.

In another device, described in an article entitled *"The MOS-Gated Emitter Switched Thyristor,"* by coinventor B. J. Baliga, published in IEEE Electron Device Letters, Vol. 11, No. 2, pp. 75–77, February, 1990, turn-on is achieved by forcing the thyristor current to flow through an N-channel enhancement-mode MOSFET and floating $N^+$ emitter integrated within the P-base region. This article is hereby incorporated herein by reference. A cross-sectional representation of this structure and equivalent circuit is shown in FIGS. 6A and 6B, which are reproductions of FIG. 1 from the aforesaid Baliga article. Because the $N^+$ emitter is electrically isolated from the cathode contact, it is commonly referred to as a "floating emitter" region. Accordingly, as used herein, a "floating emitter" is an emitter region which does not make direct electrical contact to the cathode contact.

As will be understood by one skilled in the art, the length of the floating $N^+$ emitter region, which determines the value of large resistance R shown in FIG. 6B, controls the holding current and triggering current levels for the device. Turn-off of the emitter switched device (EST) is accomplished by reducing the gate voltage on the MOSFET to below the threshold voltage. This cuts off the floating $N^+$ emitter region from the cathode and ideally shuts the device off.

Unfortunately, the integration of the MOSFET into the P-base region causes a parasitic thyristor to be formed, as shown in FIG. 6A, wherein the $N^+$ source region of the N-channel MOSFET also comprises the $N^+$ emitter of the vertical parasitic thyristor between the anode and cathode. If this thyristor turns-on, the EST can no longer be turned off by reducing the MOSFET gate voltage to zero. Turn-on of the parasitic thyristor is initiated by the onset of electron injection from the $N^+$ emitter region when forward biased and is dictated by the resistance of the P-base under the $N^+$ emitter region.

The likelihood that parasitic latch-up will occur can be reduced if the P-base resistance (small R) is lowered by making the length of the $N^+$ emitter region small and by using a P+ diffusion to reduce the sheet resistance of the P-base. By keeping the resistance under the $N^+$ emitter of the parasitic thyristor as small as possible, the probability that the $P^+/N^+$ junction will become forward biased when the thyristor is turned-on is reduced. The likelihood of injection of electrons from the $N^+$ emitter can also be reduced by shorting the $P^+$ diffusion to the cathode, as shown. These techniques can also be used to reduce the likelihood of parasitic latch-up in an EST which has a dual-channel lateral MOSFET. This EST is described in an article entitled *"High-Voltage Current Saturation in Emitter Switched Thyristors,"* by coinventors M. S. Shekar and B. J. Baliga, and M. Nandakumar, S. Tandon and A. Reisman, published in IEEE Electron Device Letters, Vol. 12, No. 7, pp. 387–389, July (1991), the disclosure of which is hereby incorporated herein by reference.

Other attempts to limit the likelihood of sustained parasitic latch-up have been made. For example, in U.S. Pat. No. 5,294,816 entitled *Unit Cell Arrangement for Emitter Switched Thyristor with Base Resistance Control,* issued Mar. 15, 1994, to coinventor M.S. Shekar, M. Nandakumar and coinventor B. J. Baliga, the probability of sustained parasitic thyristor action preventing turn-off was reduced by incorporating a current diverting means adjacent the parasitic thyristor to thereby reduce the effective resistance of the second base region during turn-off and further inhibit latch-up by preventing the forward biasing of the $P^+/N^+$ junction beneath the cathode. However, this EST includes a lateral MOSFET which can produce an additional 0.4–0.5 Volt drop across the thyristor for forward current densities in the range of 250 A/cm². Further, to obtain reasonable values for the latching and holding currents, the $N^+$ floating emitter length is typically large, thereby increasing the lateral dimensions of the EST and increasing the cell pitch.

In U.S. Pat. No. 5,306,930 entitled *Emitter Switched Thyristor with Buried Dielectric Layer*, issued Apr. 26, 1994 to coinventor B. J. Baliga, the formation of a parasitic thyristor was inhibited by incorporating a buried dielectric layer, such as silicon dioxide ($SiO_2$), between the cathode region and the second base region. The insulating region was preferably formed using a conventional SIMOX technique.

In U.S. Pat. No. 5,293,054 entitled *Emitter Switched Thyristor Without Parasitic Thyristor Latch-Up Susceptibility*, issued Mar. 8, 1994, to coinventors M. S. Shekar and B. J. Baliga, parasitic latch-up was prevented using a lateral transistor having an active region in the first base region and a metal strap on the surface of the substrate, between the lateral transistor and the thyristor's floating emitter region.

Figure 7:
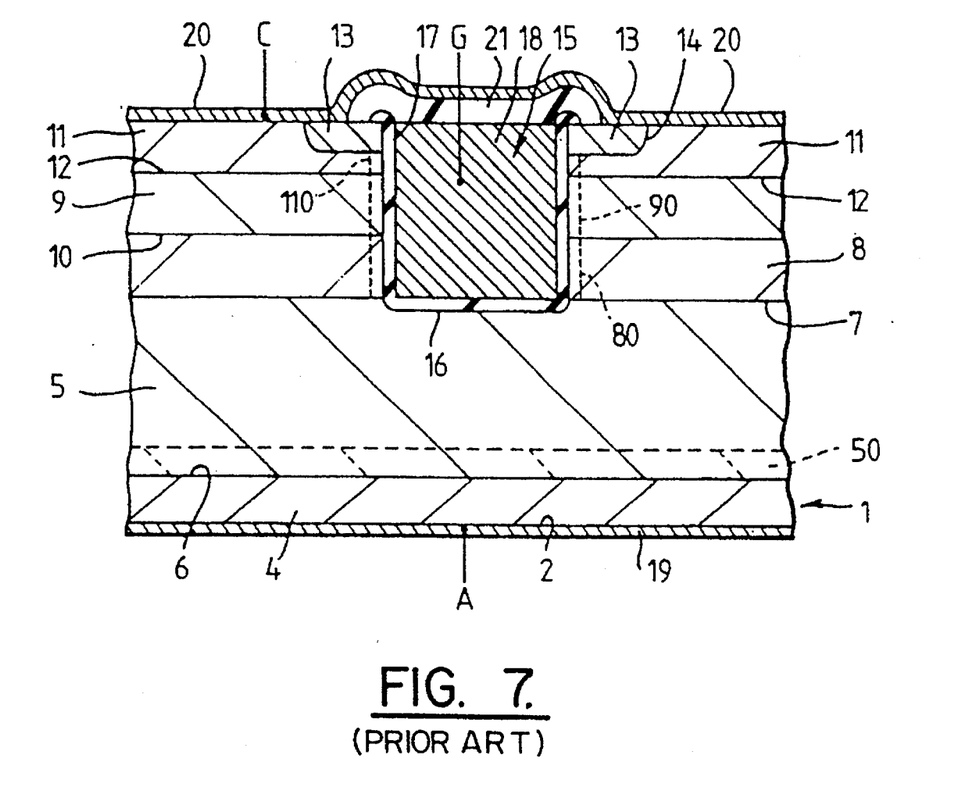
FIG. 7 is a cross-section illustration of a prior art MOS-gated thyristor.

Another example of a MOS-gated thyristor which includes a trench is disclosed in U.S. Pat. No. 5,202,750 to Gough. In particular, FIG. 7, which is a reproduction of FIG. 1 from the '750 patent, illustrates a semiconductor device having a thyristor formed by regions 4,5,8 and 9.

Notwithstanding these attempts at limiting the susceptibility of thyristors and particularly ESTs to sustained parasitic thyristor latch-up, the presence of either a current diverting means and/or insulating region between the cathode region and the second base region may increase the overall dimensions of the EST and the complexity of the fabrication process. Accordingly, an EST having reduced lateral dimensions and capable of being formed by a simplified fabrication process is desired for applications requiring low forward voltage drop, high maximum controllable current density and MOS-gated turn-on and turn-off control. It is further desirable to form an EST without a parasitic thyristor therein.

SUMMARY OF THE INVENTION

It is therefore an object of the present invention to provide a semiconductor switching device with high input impedance, low forward voltage drop and gate controlled turn-on and turn-off.

It is another object of the present invention to provide a semiconductor switching device that can be relatively easily fabricated and has reduced dimensions for achieving greater integration densities.

It is still another object of the present invention to provide a semiconductor switching device which is capable of being turned off at high forward current densities and has reduced susceptibility to parasitic latch-up relative to devices having lateral turn-on and turn-off control structures.

These and other objects and advantages of the invention are provided by a semiconductor switching device which includes a plurality of adjacent and parallel-connected switching cells in a semiconductor substrate. Each cell includes a thyristor having a floating emitter region at a bottom of a trench and a trench-gate field effect transistor (TFET) for providing turn-on and turn-off control of the thyristor. The switching device is a three-terminal device including respective anode and cathode contacts on first and second opposing faces of the substrate, and a common gate electrode.

In one embodiment of the switching device, parasitic thyristor latch-up can be suppressed by using a dual-channel TFET which forms both inversion-layer and accumulation-layer channels in series between adjacent floating emitter regions and the cathode contact. In another embodiment, parasitic thyristor latch-up is prevented by joining floating emitter regions at the bottoms of a pair of adjacent trenches to thereby eliminate a parasitic P-N-P-N path between the anode and cathode contacts. According to this second embodiment, a dual-channel TFET is preferably used to form a separate first conductivity type inversion-layer channel adjacent a first sidewall of each trench and a second conductivity type inversion-layer channel adjacent a second opposing sidewall of each trench. These channels provide the necessary electrical connections for both gated turn-on and turn-off control.

In particular, a semiconductor switching device according to one embodiment of the present invention includes a semiconductor substrate having first and second opposing faces and a trench therein at the second face. The trench may be of stripe or similar geometry and have vertical or incline sidewalls. Anode and cathode contacts are included on the first and second faces, respectively. A thyristor having a floating emitter region of first conductivity type is also included between a bottom of the trench and the first face. The sidewalls of the trench extend between the floating emitter region and the second face. Turn-on and turn-off of the thyristor is preferably performed by a dual-channel insulated-gate TFET having a gate electrode (e.g., poly-Si, metal) in the trench and a gate insulating layer (e.g. oxide) lining the trench.

The thyristor also includes a second base region of second conductivity type at the bottom of the trench. Both the floating emitter region and the second base region are preferably implanted at the trench bottom after etching, but the second base region is driven-in deeper than the floating emitter region so that the second base region surrounds the floating emitter region at the trench bottom and forms a P-N junction therewith. The second base region is also electrically connected to the cathode contact. An anode region of second conductivity type at the first face and a first base region of first conductivity type, between the anode region and the second base region, are also provided in the substrate so that a main regenerative P-N-P-N path is present between the anode region and the floating emitter region.

In addition, the first base region extends adjacent the sidewall of the trench, and a third base region of second conductivity type is provided on the first base region and forms a P-N junction therewith. The third base region preferably extends adjacent the sidewall to the second face. A cathode region of first conductivity type is also provided in the third base region, adjacent the sidewall.

The application of an appropriate turn-on bias signal to the trench gate electrode electrically connects the cathode region to the first base region via an inversion-layer channel which is established in the third base region. This electrical connection provides the base drive current to the P-N-P (or N-P-N) transistor formed by the anode, first base and second base regions. The turn-on bias signal can also be used to connect the floating emitter region to the cathode region via a series of inversion and accumulation-layer channels. For example, an appropriate turn-on bias signal will cause the formation of an inversion-layer channel in the second and third base regions, and cause the formation of an accumulation-layer channel in the first base region, at positions adjacent the trench sidewall.

Thus, if the current in the second base region is sufficient to forward bias the second base/floating emitter P-N junction, the thyristor will latch and a thyristor current will flow through the floating emitter region and the dual-channels to the cathode contact. In this embodiment, a parasitic thyristor also extends between the anode and cathode contacts and includes the regenerative path formed by the anode, first base, third base and cathode regions. However, the likelihood of parasitic latch-up is suppressed by making the cathode regions relatively small and by forming the main thyristor between the trench bottom and anode contact, instead of between the faces as in the prior art.

A semiconductor switching device according to a second embodiment of the present invention also includes a substrate having first and second faces and a trench therein at the second face. The trench includes first and second opposing sidewalls extending from a bottom of the trench to the second face. A thyristor having a floating emitter region of first conductivity type and a second base region of second conductivity type at the trench bottom is also provided in the substrate. In addition, a dual inversion-layer channel insulated-gate TFET is provided so that the application of a turn-on bias signal electrically connects the floating emitter region to the cathode contact at the second face via a first inversion-layer channel along the first sidewall. A turn-off bias signal also electrically connects the second base region to the cathode contact via a diverter region of second conductivity type and a second inversion-layer channel along the second sidewall. This latter electrical connection shunts majority carriers in the second base region to the cathode contact and thereby increases the turn-off speed of the device by reducing the effective resistance between the second base region and the cathode contact.

A pair of adjacent trenches can also be provided at the second face to define a unit cell having a mesa region which extends between opposing sidewalls of the adjacent trenches. The source regions and active (or channel) regions of the adjacent TFETs are then defined in the mesa region so that the adjacent first and second floating emitter regions (drain regions of the TFETs) can be electrically connected to a cathode contact at the second face, in response to a turn-on bias signal. In particular, the width of the mesa is selected so that the first and second floating emitter regions at the bottoms of the pair of adjacent trenches merge together and overlap one another to form a common floating emitter.

In addition, second base regions are provided at the trench bottoms and are driven-in deeper than the first and second floating emitter regions. Accordingly, the second base regions overlap and form a common second base which surrounds the common floating emitter. Because of the overlap, the common second base also extends into the mesa, between the common floating emitter and the second face, where it acts as the active region of the adjacent TFETs. The unit cell also includes a cathode region of first conductivity type (source regions of the adjacent TFETs) on the common second base. The cathode region electrically contacts the cathode contact at the second face. As will be understood by those skilled in the art, the overlap between adjacent floating emitter regions "cuts off" the parasitic thyristor which would otherwise be formed by the anode region, first base region, third base region in the mesa and the cathode region. Thus, parasitic thyristor latch-up is prevented by the second embodiment.

The use of trench processing in the above-described embodiments limits a switching device's susceptibility to parasitic latch-up by placing the main thyristor at the bottom of a trench instead of between the first and second faces of the substrate. Thus, a higher percentage of minority carriers traversing the first base region will be collected by the upper base of the main thyristor instead of the upper base of a parasitic transistor which extends between the faces. Trench processing also allows for higher integration densities by eliminating the need for lateral turn-on and turn-off FETs on the second face and replacing them with vertical devices such as trench-gate FETs.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Figure 8:
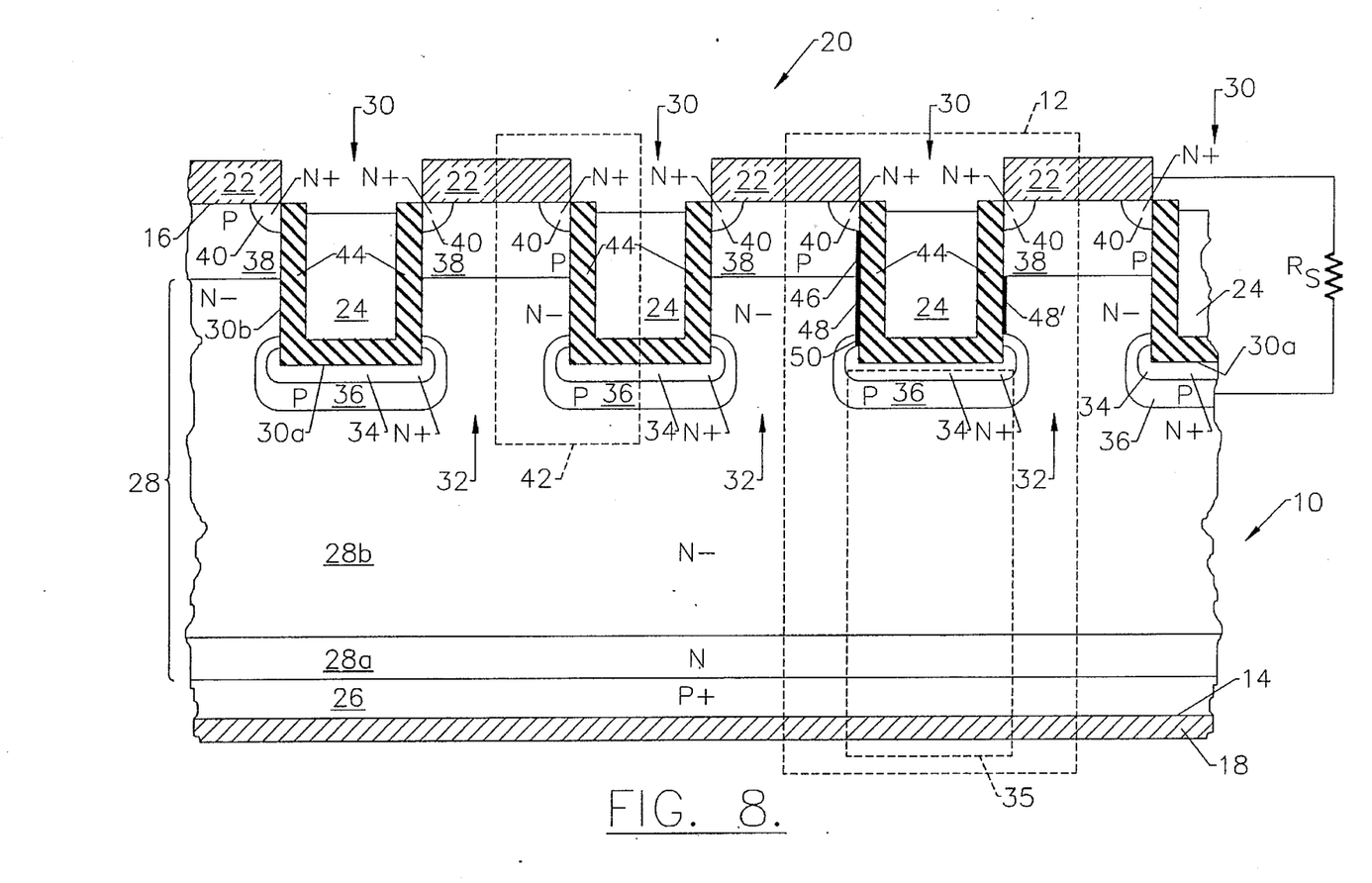
FIG. 8 is a cross-section illustration of a semiconductor switching device according to a first embodiment of the present invention.

Referring now to FIG. 8, a semiconductor substrate 10 having a plurality of switching cells 12 according to one embodiment of the present invention, is illustrated. Each switching cell 12 is preferably parallel-connected to another cell in the substrate 10, between first and second opposing faces 14 and 16, respectively. By connecting individual cells 12 in parallel, a three-terminal high-current switching device 20 can be achieved having a common anode contact 18 and cathode contact 22, and common gate electrodes 24 (e.g., poly-silicon, metal, etc.).

In particular, the switching device 20 includes an anode region 26 of second conductivity type (shown as P-type) in the substrate 1, adjacent the first face 14. The device 20 further includes a first base region 28 of first conductivity type (shown as N-type) on the anode region 26 and forming a P-N junction therewith. As illustrated, the first base region 28 preferably includes a relatively highly doped buffer region 28a, and a relatively lightly doped drift region 28b which is capable of supporting high voltages between the anode contact 18 and the cathode contact 22. In addition, a plurality of trenches 30 (i.e., grooves) are preferably formed in side by side relation in the substrate 10, at the second face 16. These trenches 30 preferably have bottoms 30a and vertical or inclined sidewalls 30b. Accordingly, mesas 32 are defined in the substrate 10, between sidewalls of the adjacent trenches. As will be understood by those skilled in the art, the trenches 30 can be of stripe or similar geometry, extending lengthwise in a third dimension, not shown. Accordingly, each of the trenches 30 can have first and second opposing sidewalls 30b which extend parallel to each other along the length of the stripe.

The switching device 20 further includes floating emitter regions 34 of first conductivity type (shown as N-type) in the first base region 28, at the bottoms 30a of the trenches 30. Second base regions 36 of second conductivity type (shown as P-type) are also provided at the bottom of the trenches 30. As illustrated, the second base regions 36 surround respective floating emitter regions 34 and form P-N junctions therewith. The second base regions 36 and floating emitter regions 34 are preferably formed by implanting respective dopants at the trench bottoms 30a after etching the trenches. The dopants of the second base regions 36 are driven-in deeper that the dopants of the floating emitter regions 34. As shown schematically, the second base regions 36 are electrically connected to the cathode contacts 22. Preferably, the electrical connections between the second base regions 36 and the cathode contacts 22 are made remotely in a third dimension along the length of the trenches 30, not shown. The resistance $R_s$ is included to illustrate the effective resistance in the second base regions 36 (underneath respective emitter regions 34), between remote portions of the second base regions 36 and the cathode contact 22.

Accordingly, main thyristors 35 are provided in the substrate, between the trench bottoms 30a and the first face 14. Insulated-gate transistor means 42 is also included adjacent the sidewalls 30b for providing turn-on and turn-off control of each thyristor 35. Preferably, insulated-gate transistor means 42 comprises a dual-channel trench-gate field effect transistor (TFET) in the substrate 10. In particular, the TFET includes a gate electrode 24 in the trench 30 and a gate insulating layer 44 (e.g., oxide) lining the trench 30, as illustrated. In addition, the first base region 28 extends into the mesas 32 and between opposing sidewalls 30b of adjacent trenches.

As will be understood by those skilled in the art, the portions of the first base region 28 in the mesas 32 act as respective first active regions for the adjacent TFETs. Third base regions 38 of second conductivity type are also provided in the mesas 32 on the first base region 28. The third base regions 38 extend to the second face 16 and electrically contact the cathode contact 22. As illustrated, the third base regions 38 act as respective second active regions for the TFETs. Finally, cathode regions 40 of first conductivity type are provided in the third base regions 38 and form P-N junctions therewith. The cathode regions 40 extend adjacent respective sidewalls 30b, as illustrated, and are made relatively small to reduce the likelihood of parasitic thyristor latch-up between regions (26, 28, 38 and 40). Accordingly, the drain and source regions of each TFET are in the first conductivity type floating emitter regions 34 and cathode regions 40. The second base regions 36, which preferably extend adjacent the sidewalls 30b, also act as third active regions of the TFETs.

Referring still to FIG. 8, the application of a sufficiently positive bias to the gate electrodes 24 will cause the formation of N-type inversion-layer channels 46 in the third base regions 38, N-type accumulation-layer channels 48 in the first base region 28 and N-type inversion-layer channels 50 in the second base regions 36, adjacent the sidewalls 30b. The channels 46 provide the base drive current to the lowermost bipolar transistors (regions 26, 28 and 36) and turn on these transistors upon the application of a sufficiently positive bias to the anode contact 18. Turn-on of the lowermost bipolar transistors causes the second base regions 36 to act as collectors of holes. Once collected, these holes travel under the floating emitter regions 34 (in a third dimension orthogonal to the cross-sectional illustration) to the cathode contacts 22, during an IGBT mode of operation. As will be understood by those skilled in the art, a sufficient hole current density in the second base regions 36 will cause the P-N junctions between the second base regions 36 and the respective floating emitter regions 34 to become forward biased, thereby initiating latch-up of the main thyristors 35 and terminating the IGBT mode of operation. The thyristor current in the floating emitter regions 34 will then flow via the channels 46–50 to the cathode contacts 22.

The thyristors 35 can also be turned off by removing the positive bias to eliminate channels 46–50 and preferably applying a sufficiently negative bias to the gate electrodes 24 to thereby create P-type inversion-layer channels 48' in the first base region, between the second base regions 36 and the third base regions 38. These inversion-layer channels 48' improve the turn-off switching speed of the device 20 by allowing excess holes in the second base regions 36 to be "swept" to the third base regions 38. This additional aspect is particularly important when the device 20 is connected to an inductive load during turn-off.

Figure 9:
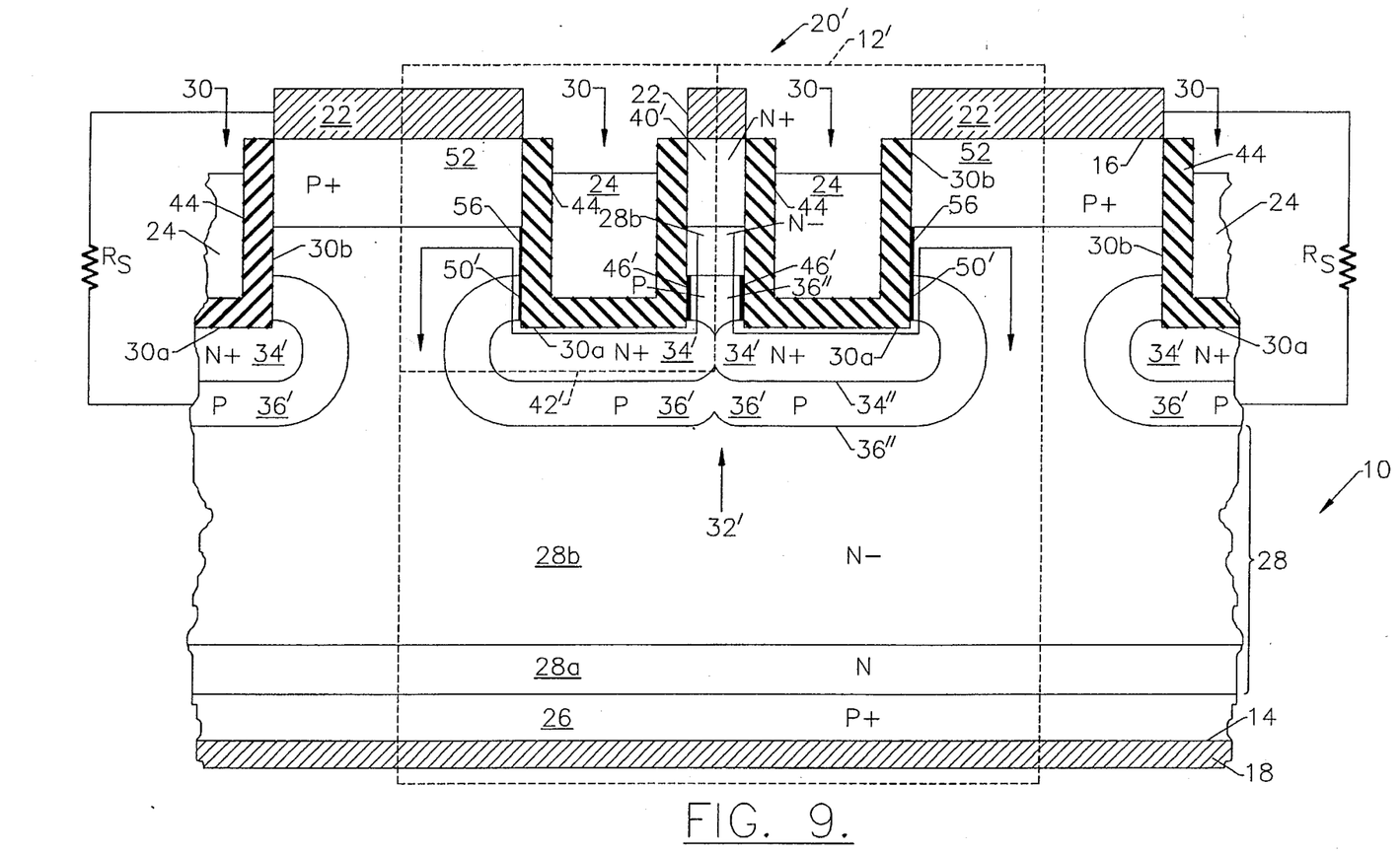
FIG. 9 is a cross-section illustration of a semiconductor switching device according to a second embodiment of the present invention.

Referring now to FIG. 9, a second embodiment according to the present invention is illustrated. This embodiment is similar to the embodiment of FIG. 8, however, all parasitic P-N-P-N paths have been eliminated from between the anode and cathode contacts, 18 and 22, respectively, by merging pairs of adjacent floating emitter regions 34' to form a common floating emitter 34" and merging pairs of adjacent second base regions 36' to form a common second base 36" which surrounds the common floating emitter 34", as illustrated, and also extends into the mesa between each pair of adjacent trenches.

Accordingly, the switching device 20' includes a unit cell 12' having a pair of trenches 30 in the substrate 10 and respective floating emitter regions 34' at the trench bottoms 30a. Each trench includes a dual inversion-layer channel insulated-gate TFET 42' therein so that the application of a turn-on bias signal electrically connects the floating emitter regions 34' to the cathode contact 22 and the application of a turn-off bias signal electrically connects the second base regions 36' to the cathode contact 22 via the second conductivity type diverter regions 52. In particular, the portion of the common second base 36" which extends between the adjacent trenches of the unit cell 12' forms the active regions of the back-to-back TFETs 42'. The cathode region 41' formed thereon also acts as the source regions of the TFETs 42', as illustrated.

Thus, the application of a positive turn-on bias to gate electrodes 24 of the unit cell 12' causes the formation of inversion-layer channels 46' in the common second base 36", adjacent opposing sidewalls 30b, as illustrated. These inversion-layer channels 46' electrically connect the common floating emitter 34" to the cathode regions 40' and cathode contact 22. The application of the positive bias also causes the formation of inversion-layer channels 50' in the second base regions 36'. As illustrated, these channels 50' extend adjacent sidewalls 30b. The inversion-layer channels 50' electrically connect the floating emitter regions 34' to the first base region 28. As will be understood by those skilled in the art, the inversion-layer channels 46' and 50' provide a path for electrons to flow from the cathode contact 22 to the common floating emitter 34' and to the first base region 28, along the path as illustrated by the arrows. These electrical connections facilitate turn-on of the thyristor formed by regions (26, 28, 36' and 34') by providing the base drive current to the bipolar transistor formed by regions (26, 28 and 36').

Turn-off of the thyristor occurs by removing the positive bias from the gate electrodes 24 to eliminate the inversion-layer channels 46' and 50'. Faster turn-off can be achieved by applying a negative bias to the gate electrodes 24 so that second conductivity type inversion-layer channels 56 are formed in the first base region 28, between the second base regions 36' and the diverter regions 52. These inversion-layer channels 56 improve the turn-off speed by shunting majority carriers (e.g., holes) in the second base regions 36' to the cathode contact 22.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:

a semiconductor substrate having first and second opposing faces;

a first base region of first conductivity type in said substrate;

an anode region of second conductivity type in said substrate, between said first base region and said first face;

a trench in said substrate at said second face, said trench having a trench sidewall extending adjacent said first base region and a trench bottom;

a floating emitter region of first conductivity type at the bottom of said trench;

a second base region of second conductivity type surrounding said floating emitter region at the bottom of said trench and forming a P-N junction therewith and a P-N junction with said first base region;

a third base region of second conductivity type in said substrate, between said first base region and said second face, said third base region extending adjacent the trench sidewall and forming a P-N junction with said first base region;

a cathode region of first conductivity type in said third base region, said cathode region extending adjacent the trench sidewall;

a cathode contact on the second face, electrically connected to said cathode region, said second base region and said third base region;

an anode contact on the first face, electrically connected to said anode region; and insulated-gate transistor means, in said substrate, for electrically connecting said cathode region to said first base region in response to a turn-on bias signal, said insulated-gate transistor means comprising a dual-channel field effect transistor having active regions in said first, second and third base regions, a gate electrode in said trench and a gate insulating layer lining said trench so that the trench sidewall defines an interface between said gate insulating layer and said first base region and an interface between said gate insulating layer and said third base region.

2. The semiconductor switching device of claim 1, wherein said second base region extends adjacent the sidewall of said trench so that the trench sidewall defines an interface between said second base region and said gate insulating layer and wherein the application of the turn-on bias signal to said gate electrode electrically connects said cathode region to said first base region by a first inversion-layer channel in said third base region and electrically connects said floating emitter region to said first base region by a second inversion-layer channel in said second base region.

3. The semiconductor switching device of claim 2, wherein the application of the turn-on bias signal to said gate electrode electrically connects the first inversion-layer channel to the second inversion-layer channel in series by an accumulation-layer channel in said first base region.

4. The semiconductor switching device of claim 3, wherein the application of a turn-off bias signal to said gate electrode electrically connects said second base region to said third base region by an inversion-layer channel in said first base region.

5. A semiconductor switching device comprising:

a semiconductor substrate having first and second opposing faces;

a trench in said substrate at said second face;

an anode contact on said first face;

a cathode contact on said second face;

a thyristor between a bottom of said trench and said first face, said thyristor having a floating emitter region of first conductivity type at the trench bottom; and a dual inversion-layer channel insulated-gate field effect transistor having a gate electrode in said trench, a gate electrode insulating layer extending adjacent a sidewall of said trench, a first active region of first conductivity type in said substrate, opposite said gate electrode insulating layer, and second and third active regions of second conductivity type in said substrate, opposite said gate electrode insulating layer, wherein said first active region extends between said second and third active regions and forms P-N junctions therewith, wherein the application of a turn-on bias signal to said gate electrode electrically connects said floating emitter region to said cathode contact by a first conductivity type inversion-layer channel in said second active region and a first conductivity type inversion-layer channel in said third active region and wherein the application of a turn-off bias signal to said gate electrode electrically connects said third active region to said second active region by a second conductivity type inversion-layer channel in said first active region.

6. A semiconductor switching device comprising:

a semiconductor substrate having first and second opposing faces;

an anode region in said substrate adjacent said first face;

a first base region of first conductivity type in said substrate, on said anode region;

a trench in said substrate at said second face, said trench having a trench bottom and first and second trench sidewalls;

a floating emitter region of first conductivity type and a second base region of second conductivity type at said trench bottom, said second base region extending between said first base region and said floating emitter region and forming P-N junctions therewith; and a dual inversion-layer channel field effect transistor in said trench, said transistor having first and second conductivity type active regions in said substrate, adjacent the first and second sidewalls of the trench, respectively, wherein said first base region comprises said first conductivity type active region, wherein said second base region comprises said second conductivity type active region, wherein the application of a turn-on gate bias signal to said transistor causes the formation of a first conductivity type inversion-layer channel in said second base region, adjacent the second sidewall, and wherein the application of a turn-off gate bias signal to said transistor causes the formation of a second conductivity type inversion-layer channel in said first base region, adjacent the first sidewall.

7. The semiconductor switching device of claim 6, further comprising a diverter region of second conductivity type in said substrate, extending adjacent the first sidewall and said second face; and a cathode region of first conductivity type in said substrate, extending adjacent the second sidewall and said second face.

8. The semiconductor switching device of claim 6, wherein the application of a turn-on gate bias signal to said dual inversion-layer channel field effect transistor also causes the formation of a first conductivity type inversion-layer channel in the second base region, adjacent the first sidewall and between said floating emitter region and said first base region.

9. A semiconductor switching device comprising:

a semiconductor substrate having first and second opposing faces;

an anode region in said substrate adjacent said first face;

first and second adjacent trenches in said substrate at said second face, and wherein each of said trenches has trench bottoms and first and second trench sidewalls;

a first base region of first conductivity type in said substrate, said first base region extending between said anode region and the first sidewall of said first trench and between said anode region and the first sidewall of said second trench;

first and second overlapping floating emitter regions of first conductivity type at the bottoms of said first and second trenches, respectively;

overlapping second base regions of second conductivity type at the bottoms of said first and second trenches, said overlapping second base regions extending between said first base region and said overlapping floating emitter regions;

a cathode region of first conductivity type on said overlapping second base regions and extending to said second face, said cathode region extending adjacent the second sidewalls of said first and second trenches;

first and second diverter regions of second conductivity type in said substrate which extend adjacent the first sidewalls of said first and second trenches, respectively, and form P-N junctions with said first base region; and first and second dual inversion-layer channel field effect transistors in said first trench and in said second trench, respectively, wherein the application of a turn-on gate bias signal to said first and second dual-channel field effect transistors causes the formation of first conductivity type inversion-layer channels adjacent the second sidewalls; and wherein the application of a turn-off gate bias signal to said first and second dual-channel field effect transistors causes the formation of second conductivity type inversion-layer channels in said first base region and wherein one of said second conductivity type inversion-layer channels extends between said overlapping second base regions and said first diverter region and the other of said second conductivity type inversion-layer channels extends between said overlapping second base regions and said second diverter region.

10. The semiconductor switching device of claim 9, wherein the application of a turn-on gate bias signal to said first and second dual inversion-layer channel field effect transistors causes the formation of first conductivity type inversion-layer channels in the overlapping second base regions, adjacent the first sidewalls.

11. The semiconductor switching device of claim 9, wherein the application of a turn-on gate bias signal to said first and second dual inversion-layer channel field effect transistors causes the formation of first conductivity type inversion-layer channels in the overlapping second base regions, adjacent the second sidewalls.

12. A semiconductor switching device comprising:

a semiconductor substrate having first and second opposing faces;

an anode region in said substrate adjacent said first face;

a first base region of first conductivity type in said substrate, on said anode region;

first and second adjacent trenches in said substrate at said second face, and wherein each of said trenches has trench bottoms and first and second opposing trench sidewalls;

a common floating emitter of first conductivity type at the bottoms of said first and second trenches;

a common second base of second conductivity type surrounding said common floating emitter and forming a P-N junction therewith;

a cathode region of first conductivity type in said substrate, between the second sidewalls of said first and second trenches;

first and second diverter regions of second conductivity type in said substrate, said diverter regions forming P-N junctions with said first base region of first conductivity type and extending adjacent the first sidewalls of said first and second adjacent trenches but not extending adjacent the second sidewalls of said first and second adjacent trenches; and first and second dual-channel field effect transistors having insulated gate electrodes, in said first trench and in said second trench, respectively, so that the first sidewalls of said first and second trenches define an interface between said insulated gate electrodes and said first base region.

13. The semiconductor switching device of claim 12, wherein the application of a turn-on gate bias signal to said first and second dual-channel field effect transistors causes the formation of first conductivity type inversion-layer channels in the common second base, adjacent the second sidewalls.

14. The semiconductor switching device of claim 12, wherein the application of a turn-off gate bias signal to said first and second dual-channel field effect transistors causes the formation of second conductivity type inversion-layer channels in the first base region, adjacent the first sidewalls of said first and second adjacent trenches.

15. The semiconductor switching device of claim 13, wherein the application of a turn-on gate bias signal to said first and second dual-channel field effect transistors causes the formation of first conductivity type inversion-layer channels in the common second base, adjacent the first sidewalls.

16. An emitter switched thyristor, comprising:

a semiconductor substrate having first and second opposing faces;

anode and cathode contacts on said first and second faces, respectively;

anode and cathode regions of opposite conductivity type in said substrate, adjacent said first and second faces, respectively;

a plurality of adjacent trenches in said substrate, at said second face;

a plurality of electrically insulated gate electrodes in respective ones of said plurality of trenches;

a first base region of same conductivity type as said cathode region in said substrate, said first base region forming a P-N junction with said anode region and extending between adjacent ones of said trenches so that sidewalls of said trenches define a plurality of interfaces between said first base region and said plurality of electrically insulated gate electrodes;

a plurality of floating emitter regions of same conductivity type as said cathode region in said substrate, each of said floating emitter regions extending adjacent a bottom of said plurality of trenches;

a plurality of second base regions of same conductivity type as said anode region in said substrate, each of said second base regions surrounding a respective floating emitter region at a bottom of said plurality of trenches and forming a P-N junction therewith;

a plurality of third base regions of same conductivity type as said anode region in said substrate, each of said third base regions extending between the sidewalls of adjacent ones of said plurality of trenches, forming respective P-N junctions with said first base region and forming respective ohmic contacts with said cathode contact at the second face;

wherein the application of a turn-on bias signal to said plurality of insulated gate electrodes causes the formation of a plurality of first conductivity type inversion-layer channels in said third base regions which electrically connect said first base region to said cathode contact; and wherein the application of a turn-off bias signal to said plurality of insulated gate electrodes causes the formation of a plurality of second conductivity type inversion-layer channels in said first base region which electrically connect said plurality of second base regions to said plurality of third base regions.

17. The emitter switched thyristor of claim 16, wherein the application of the turn-on bias signal to said plurality of insulated gate electrodes causes the formation of a plurality of first conductivity type inversion-layer channels in said second base regions which electrically connect said first base region to said plurality of floating emitter regions.

* * * * *